(12) United States Patent
Stockstad (10) Patent No.: US 6,788,506 B1
(45) Date of Patent: *Sep. 7, 2004

(54) INTEGRATED CIRCUIT AND METHOD OF OPERATION

(75) Inventor: Troy L. Stockstad, Chandler, AZ (US)

(73) Assignee: Standard Microsystems Corporation, Hauppauge, NY (US)

( * ) Notice: Subject to any disclaimer, the term of this patent is extended or adjusted under 35 U.S.C. 154(b) by 534 days.

This patent is subject to a terminal disclaimer.

(21) Appl. No.: 09/711,420

(22) Filed: Nov. 13, 2000

(51) Int. Cl.[7] .................................................. H02H 9/00
(52) U.S. Cl. ............................ 361/56; 361/58; 361/91.1
(58) Field of Search ........................... 361/56, 58, 91.1, 361/113, 117, 118, 127, 18

(56) References Cited

U.S. PATENT DOCUMENTS 5,164,659 A * 11/1992 Schultz et al. ............... 323/351
6,429,685 B1 * 8/2002 Stockstad ..................... 326/83

* cited by examiner

Primary Examiner—Stephen W. Jackson
(74) Attorney, Agent, or Firm—Bryan Cave LLP (57) ABSTRACT

An integrated circuit includes circuit nodes (111 and 131), a resistor (210) coupling together the nodes, a comparator (230) having two inputs and an output where a first one of the two inputs is coupled to the resistor and a first one of the nodes, and a three-terminal device (220) having a first terminal coupled to a second one of the nodes and the resistor and also having a second terminal coupled to the output of the comparator.

30 Claims, 3 Drawing Sheets

INTEGRATED CIRCUIT AND METHOD OF OPERATION

FIELD OF THE INVENTION

This invention relates to electronics, in general, and to integrated circuits and methods of operation, in particular.

BACKGROUND OF THE INVENTION

Many integrated circuits are highly sensitive to voltage spikes or surges caused by Electro-Static Discharge (ESD), Electrical Fast Transients (EFT), and lightning. Additionally, voltages that exceed a maximum voltage rating of an integrated circuit may be accidentally applied to the integrated circuit, thereby damaging the integrated circuit. Accordingly, these highly sensitive integrated circuits must be protected from the voltage spikes or surges. One technique to protect the highly sensitive integrated circuits is to connect a separate or discrete transient over-voltage protection component in series with the highly sensitive integrated circuit. These discrete techniques, however, are expensive and cumbersome because they require an additional component.

Another technique to protect the highly sensitive integrated circuits includes integrating a transient over-voltage protection sub-circuit into the integrated circuit. The existing integrated transient over-voltage protection techniques suffer from several problems. For example, standard ESD protection structures are not capable of protecting sensitive circuitry from steady-state over-voltage conditions because ESD circuits only protect against transient voltage spikes of short duration. Additionally, many over-voltage detection techniques, such as diode clamping, may still allow unacceptably high voltages to be transferred to the sensitive circuitry before the over-voltage protection is activated.

Accordingly, a need exists for an integrated circuit and method of operation that is protected from short-term and long-term voltage spikes or surges where such protection is integrated into the integrated circuit. For example, the Universal Serial Bus (USB) specification requires a USB transceiver to withstand a continuous short-circuit of an over-voltage that exceeds the supply voltage used in the USB transceiver. For example, the USB specification requires the input/output (I/O) terminals of a USB transceiver to survive a continuous short-circuit to 5.25 volts, but present semiconductor processes used to implement USB transceivers may only be rated to a maximum voltage of 3.6 volts or less. Furthermore, the USB transceiver is required to withstand the continuous short-circuit of the over-voltage for a minimum of 24 hours without degrading the performance of the USB transceiver. Moreover, the USB specification recommends that USB transceivers be designed to withstand such over-voltage short-circuits indefinitely. Many other serial data communication standards also face similar reliability concerns.

SUMMARY OF THE INVENTION

In accordance with the principles of the invention, a first embodiment of an integrated circuit comprises a first node; a second node; a resistor coupling together the first and second nodes; a comparator having two inputs and an output, a first one of the two inputs coupled to the resistor and the first node; and a three-terminal device having a first terminal coupled to the second node and the resistor and having a second terminal coupled to the output of the comparator.

Furthermore, in accordance with the principles of the invention, a second embodiment of an integrated circuit comprises a first circuit; a first node; and a second circuit coupling the first circuit to the first node. In this embodiment, the first circuit operates off of a supply voltage, and the second circuit detects a voltage magnitude of a signal at the first node and reduces the voltage magnitude of the signal to equal a voltage magnitude of the supply voltage before transmitting the signal to the first circuit.

In accordance with the principles of the invention, a third embodiment of an integrated circuit comprises a first node; a second node; a first resistor coupling together the first and second nodes; a first three-terminal device being of a first type, a first terminal of the first three-terminal device coupled to the first resistor and the first node; a second three-terminal device being of the first type, a first terminal of the second three-terminal device coupled to a first substantially constant voltage, a second terminal of the second three-terminal device coupled to a second terminal of the first three-terminal device and to a third terminal of the second three-terminal device; a third three-terminal device being of a second type, a first terminal of the third three-terminal device coupled to a second substantially constant voltage, a third terminal of the third three-terminal device coupled to a third terminal of the first three-terminal device; a fourth three-terminal device being of the second type, a first terminal of the fourth three-terminal device coupled to the second substantially constant voltage, a second terminal of the fourth three-terminal device coupled to a second terminal of the third three-terminal device and to a third terminal of the fourth three-terminal device; a fifth three-terminal device being of the second type, a first terminal of the fifth three-terminal device coupled to the second substantially constant voltage, a second terminal of the fifth three-terminal device coupled to the third terminals of the first and third three-terminal devices, a third terminal of the fifth three-terminal device coupled to the first resistor and to the second node; a sixth three-terminal device being of the first type, a first terminal of the sixth three-terminal device coupled to the third terminals of the first and third three-terminal devices and to the second terminal of the fifth three-terminal device, a second terminal of the sixth three-terminal device coupled to the first substantially constant voltage, a third terminal of the sixth three-terminal device coupled to the second terminals of the third and fourth three-terminal devices and to the third terminal of the fourth three-terminal device; and a second resistor coupling together the second terminals of the first and second three-terminal devices and the third terminal of the second three-terminal device to the second terminals of the third and fourth three-terminal devices and to the third terminals of the fourth and sixth three-terminal devices.

In accordance with the principles of the invention, an embodiment of a method of operating an integrated circuit comprises detecting a signal at a first node, the signal having a first voltage magnitude; comparing the first voltage magnitude to a reference voltage magnitude; if the first voltage magnitude is less than the reference voltage magnitude, transferring the signal with the first voltage magnitude to a second node; and if the first voltage magnitude is greater than the reference voltage magnitude, reducing the first voltage magnitude to a second voltage magnitude less than or equal to the reference voltage magnitude; and transferring the signal with the second voltage magnitude to the second node.

BRIEF DESCRIPTION OF THE DRAWINGS

The invention will be better understood from a reading of the following detailed description, taken in conjunction with the accompanying drawing figures in which.

For simplicity and clarity of illustration, the drawing figures illustrate the general manner of construction, and descriptions and details of well-known features and techniques are omitted to avoid unnecessarily obscuring the invention. Additionally, elements in the drawing figures are not necessarily drawn to scale, and the same reference numerals in different figures denote the same elements.

Furthermore, the terms first, second, third, fourth, and the like in the description and in the claims, if any, are used for distinguishing between similar elements and not necessarily for describing a sequential or chronological order. It is further understood that the terms so used are interchangeable under appropriate circumstances and that the embodiments of the invention described herein are capable of operation in other sequences than described or illustrated herein.

DETAILED DESCRIPTION OF THE DRAWINGS

Figure 1:
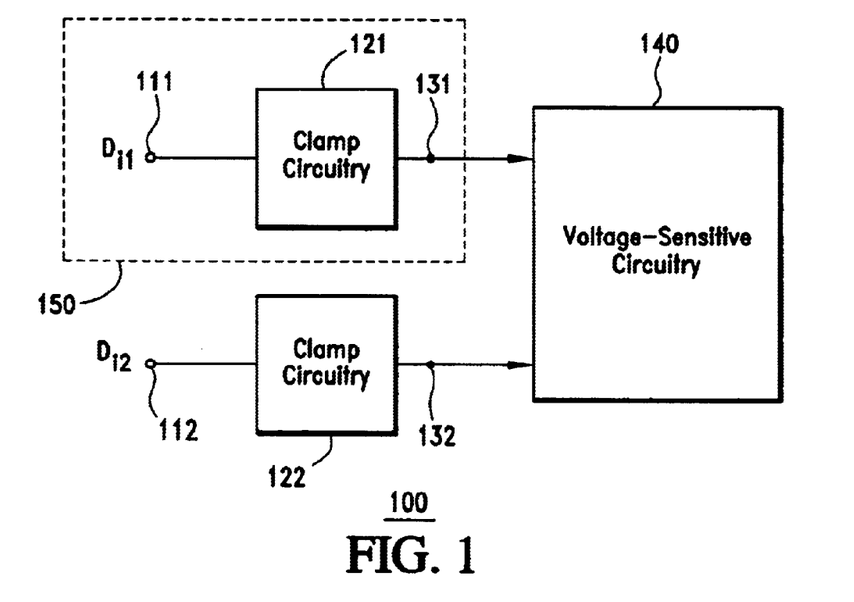
FIG. 1 illustrates a block diagram of an integrated circuit in accordance with an embodiment of the invention.

FIG. 1 illustrates a block diagram of an integrated circuit 100. Circuit 100 comprises an input or node ($D_{i1}$) 111 and another input or node ($D_{i2}$) 112. Circuit 100 also comprises over-voltage circuits or voltage clamp circuits 121 and 122. Nodes 111 and 112 are coupled to clamp circuits 121 and 122, respectively. The term "coupled" is defined as directly or indirectly connected in an electrical manner.

Circuit 100 further comprises a voltage-sensitive circuit 140. As an example, circuit 140 can be a USB transceiver. Circuit 140 is coupled to circuits 121 and 122 via circuit nodes 131 and 132, respectively. Circuit 121 couples circuit 140 to node 111, and circuit 122 couples circuit 140 to node 112. Nodes 111 and 131 and circuit 121 form a portion 150 of circuit 100. Portion 150 of circuit 100 is identified in FIG. 1 by a dashed region.

In operation, circuits 121, 122, and 140 operate off of a supply voltage while circuit 121 detects a signal at node 111. In particular, circuit 121 detects or measures a voltage magnitude of the signal at node 111. If the voltage magnitude is greater than a magnitude of the supply voltage, then circuit 121 reduces the voltage magnitude of the signal to be less than or equal to the voltage magnitude of the supply voltage before transmitting the signal to circuit 140 via node 131. Similarly, circuit 122 detects or measures a voltage magnitude of a different signal at node 112. If the voltage magnitude of the different signal is greater than the magnitude of the supply voltage, then circuit 122 reduces the voltage magnitude of the different signal to be less than or equal to the magnitude of the supply voltage before transmitting the different signal to circuit 140 via node 132. Circuit 140 processes the signals received from circuits 121 and 122.

Figure 2:
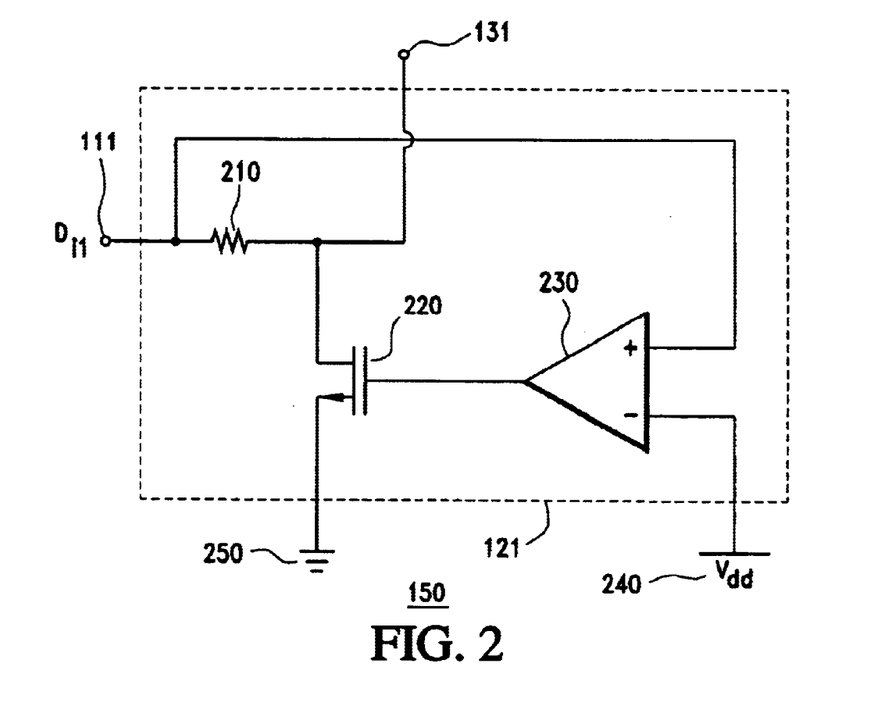
FIG. 2 illustrates a circuit diagram of a portion of the integrated circuit of FIG. 1 in accordance with an embodiment of the invention.

FIG. 2 illustrates a circuit diagram of portion 150 of circuit 100 in FIG. 1. Portion 150 includes nodes 111 and 131 and circuit 121. Circuit 121 is identified in FIG. 2 by a dashed region.

Circuit 121 is illustrated in FIG. 2 to include a resistor 210 coupling together nodes 111 and 131. Circuit 121 is also illustrated in FIG. 2 to comprise a comparator 230. Comparator 230 has two inputs and an output. A first one of the two inputs, or a positive input, is coupled to resistor 210 and to node 111. A second one of the two inputs, or a negative input, is coupled to a substantially constant voltage 240. In the preferred embodiment, substantially constant voltage 240 is a power or voltage supply ($V_{dd}$). In a different embodiment, substantially constant voltage 240 can have a voltage less than the voltage supply and greater than a ground potential.

The term "substantially constant" in the phrase "substantially constant voltage" does not mean permanently constant. For example, circuit 121 can be turned off or placed into a sleep mode, where the supply voltage is turned off and provides a voltage potential of zero volts. Therefore, substantially constant voltage 240 can be substantially constant at one level, such as 3.3 volts, for an extended period of time. Then, substantially constant voltage 240 can have another substantially constant voltage, such as zero volts, for an extended period of time.

Circuit 121 is further illustrated in FIG. 2 to comprise a three-terminal device 220 of a first type. As an example, the first type of three-terminal device, such as device 220, can be a Field-Effect Transistor (FET) or a bipolar transistor. The FET can be a Metal-Oxide-Semiconductor FET (MOSFET), a Junction FET (JFET), or a MEtal-Semiconductor FET (MESFET). The three terminals of a FET are a source electrode, a gate electrode, and a drain electrode. The three terminals of a bipolar transistor are an emitter electrode, a base electrode, and a collector electrode. The gate electrode of a FET is its control electrode, and the base electrode of a bipolar transistor is its control electrode. In the preferred embodiment, the first type of three-terminal device, such as device 220, is an n-channel MOSFET. Accordingly, in the preferred embodiment, device 220 has a source electrode, a gate electrode, and a drain electrode where the gate electrode is the control electrode or control terminal for device 220.

The term "three-terminal device" is defined as a device having at least three terminals. Therefore, the three-terminal device can also have four terminals. For example, the three-terminal device can be a FET with an additional bulk or backgate electrode that is coupled to a voltage potential. In the preferred embodiment, the bulk electrode, when used, is coupled to a ground potential, to the source electrode for an n-channel MOSFET, or to the source electrode or the positive supply rail for a p-channel MOSFET.

A first terminal, or the source electrode, of device 220 is coupled to a substantially constant voltage 250. In the preferred embodiment, substantially constant voltage 250 is approximately zero volts and is provided by a ground potential. In an alternative embodiment, substantially constant voltage 250 can be provided by a power supply or voltage supply having a voltage less than or greater than zero volts. A second terminal, or the gate electrode, of device 220 is coupled to the output of comparator 230. A third terminal, or the drain electrode, of device 220 is coupled to resistor 210 and node 131.

In operation, an input signal is coupled to or transmitted to node 111. Comparator 230 compares a magnitude of the voltage of the input signal to a magnitude of substantially constant voltage 240. When comparator 230 determines the magnitude of the voltage of the input signal to be less than or equal to the magnitude of substantially constant voltage 240, comparator 230 transmits a low signal from its output to the second terminal of device 220 to turn off device 220. With device 220 being off, device 220 does not draw any current through resistor 210. Thus, when the input signal is transmitted across resistor 210 from node 111 to node 131, the magnitude of the voltage of the input signal remains approximately constant.

When comparator 230 determines the magnitude of the voltage of the input signal to be greater than the magnitude of substantially constant voltage 240, however, comparator 230 transmits a high signal from its output to the second terminal of device 220 to turn on device 220. Device 220 draws a current through resistor 210 to reduce the magnitude of the voltage of the input signal at node 131. Device 220 remains on and preferably continues to draw more current through resistor 210 until the voltage at node 131 is less than or equal to the magnitude of substantially constant voltage 240.

Figure 3:
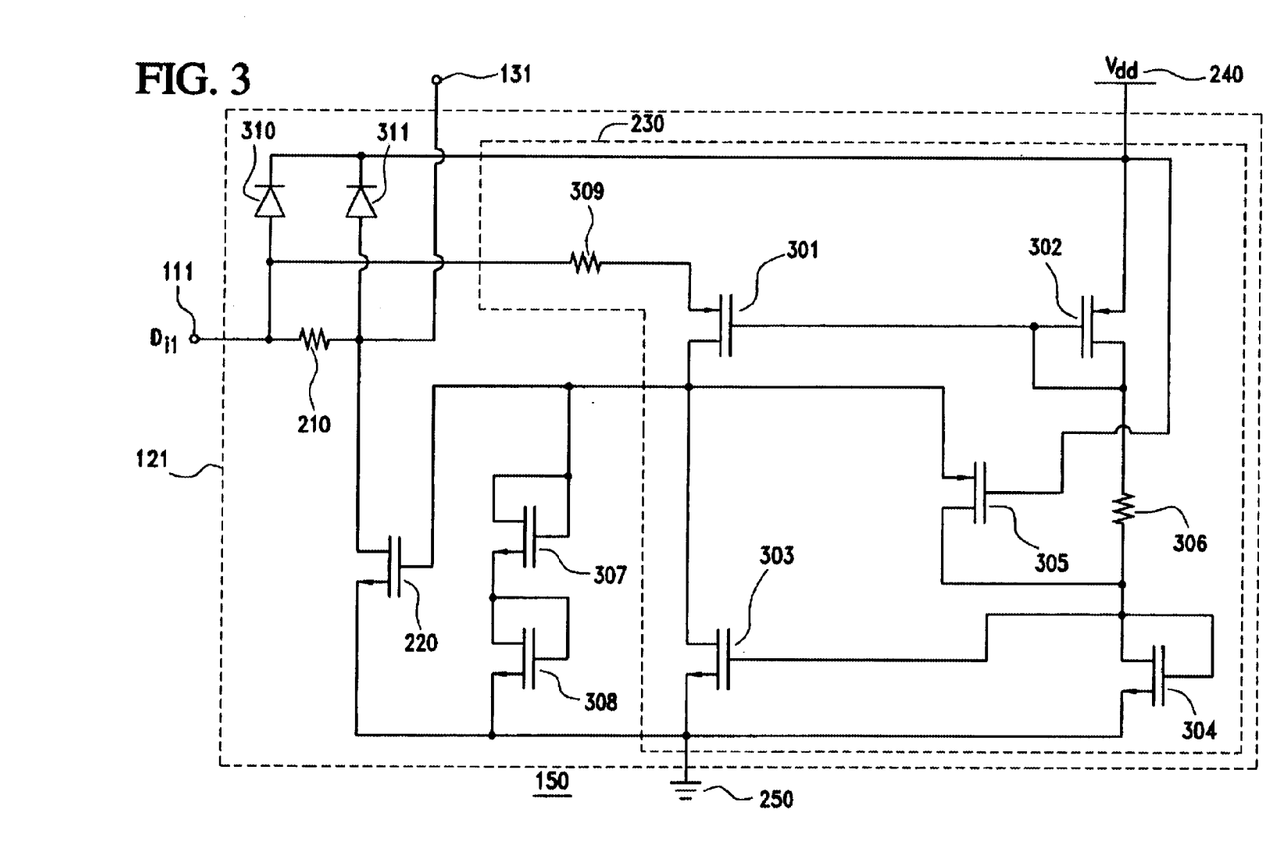
FIG. 3 illustrates another circuit diagram of the portion of the integrated circuit of FIG. 1 in accordance with an embodiment of the invention.

FIG. 3 illustrates a circuit diagram of a portion 150 of integrated circuit 100 in FIG. 1. As explained earlier with reference to FIGS. 1 and 2, portion 150 comprises node ($D_{i1}$) 111, circuit 121, and node 131. As explained earlier with reference to FIG. 2, circuit 121 comprises resistor 210, three-terminal device 220, and comparator 230. Circuit 121 and comparator 230 are each identified in FIG. 3 by separate dashed regions.

As described earlier with reference to FIG. 2, comparator 230 compares two voltages. As illustrated in FIG. 3, however, comparator 230 is built out of a current mirror. Accordingly, comparator 230 can be referred to as a current comparator.

In particular, as illustrated in FIG. 3, comparator 230 is comprised of a three-terminal device 301 of the second type. As an example, the second type of three-terminal device, such as device 301, can be a Field-Effect Transistor (FET) or a bipolar transistor. The FET can be a Metal-Oxide-Semiconductor FET (MOSFET), a Junction FET (JFET), or a MEtal-Semiconductor (MESFET). In the preferred embodiment, the second type of three-terminal device, such as device 301, is a p-channel MOSFET. Accordingly, in the preferred embodiment, the second terminal or control electrode for device 301 is its gate electrode. A first terminal of three-terminal device 301 is its source electrode, which is coupled to resistor 210 and node 111. A third terminal of three-terminal device 301 is its drain electrode, which is coupled to the second terminal of device 220.

Comparator 230 also comprises a three-terminal device 302 of the second type. A first terminal, or source electrode, of device 302 is coupled to substantially constant voltage 240. A second terminal, or gate electrode, of device 302 is coupled to a second terminal, or gate electrode, of device 301. The second terminal of device 302 is also coupled to a third terminal, or drain electrode, of device 302. In the preferred embodiment, device 302 is the same size as device 301.

Comparator 230 additionally comprises a three-terminal device 303 of the first type. A first terminal, or source electrode, of device 303 is coupled to the other substantially constant voltage 250. A third terminal, or drain electrode, of device 303 is coupled to the third terminal of device 301 and to the second terminal of device 220.

Comparator 230 further comprises a three-terminal device 304 of the first type. A first terminal, or source electrode, of device 304 is coupled to substantially constant voltage 250. A second terminal, or gate electrode, of device 304 is coupled to a second terminal, or gate electrode, of device 303 and is also coupled to a third terminal, or drain electrode, of device 304. In the preferred embodiment, device 304 is four times smaller than device 303.

Comparator 230 still further comprises a three-terminal device 305 of the second type. A first terminal, or source electrode, of device 305 is coupled to the third terminals of devices 301 and 303 and is also coupled to the second terminal of device 220. A second terminal, or gate electrode, of device 305 is coupled to substantially constant voltage 240. A third terminal, or drain electrode, of device 305 is coupled to the second terminals of devices 303 and 304 and also to the third terminal of device 304.

Comparator 230 also comprises a resistor 306. Resistor 306 couples together the second terminals of devices 301 and 302 and the third terminal of device 302 to the second terminals of devices 303 and 304 and also to the third terminals of devices 304 and 305.

Comparator 230 can optionally comprise a resistor 309. As explained in more detail hereinafter, resistor 309 can limit the amount of current transmitted from node 111 to the first terminal of device 301. Resistor 309 couples node 111 and resistor 210 to the first terminal of device 301.

As illustrated in FIG. 3, circuit 121 also comprises optional three-terminal devices 307 and 308 of the first type. Devices 307 and 308 can be included in portion 150 to ensure that the voltage at the second terminal of device 220 is not too high to damage device 220. The first terminal, or source electrode, of device 308 is coupled to substantially constant voltage 250. A second terminal, or gate electrode, of device 308 is coupled to a third terminal, or drain electrode, of device 308. A first terminal, or source electrode, of device 307 is coupled to the second and third terminals of device 308. A second terminal, or gate electrode, of device 307 is coupled to a third terminal, or drain electrode, of device 307 and is also coupled to the second terminal of device 220, the third terminals of devices 301 and 303, and the first terminal of device 305.

Circuit 121 can still further comprise optional diodes 310 and 311. Diodes 310 and 311 can be included in portion 150 for ESD protection. Diode 310 electrically couples node 111, resistor 210, and resistor 309 to substantially constant voltage 240. Diode 311 electrically couples node 131, resistor 210, and the third terminal of device 220 to substantially constant voltage 240.

Circuit 121 operates according to the following description. An output side, or high impedance side, of current comparator 230, which comprises device 301, monitors a signal at node 111. In particular, device 301 monitors a magnitude of a voltage at node 111. Current comparator 230 also has a reference side, which is comprised of device 302. Device 302 references a magnitude of substantially constant voltage 240.

The current along the reference side of current comparator 230 is calculated to be equal to substantially constant voltage 240 minus the diode voltage drops of devices 302 and 304, the total of which is divided by the resistance of resistor 306. As indicated earlier, device 303 is four time larger than device 304. Accordingly, the output side of current comparator 230 desires a magnitude of current that is four times larger than the current along the reference side of current comparator 230.

When the magnitude of the voltage at node 111 is equal to the magnitude of substantially constant voltage 240, the current along the output side of current comparator 230 is approximately equal to the magnitude of the current along the reference side of current comparator 230 because devices 301 and 302 are the same size. The output side of current comparator 230, however, desires a current four times greater than the current along the reference side of current comparator 230. Accordingly, the output of current comparator 230 will be a low voltage signal, which turns device 220 off. When device 220 is off, no current is drawn through resistor 210 by device 220, and the voltage at node 111 is transferred across resistor 210 to node 131 without being substantially changed. The same result occurs when the magnitude of the voltage at node 111 is less than the magnitude of substantially constant voltage 240.

When the magnitude of the voltage at node 111 is greater than the magnitude of substantially constant voltage 240, however, the magnitude of the current along the output side of current comparator 230 increases. If the magnitude of the voltage at node 111 is substantially higher, by 100 millivolts for example, than the magnitude of substantially constant voltage 240, then the current along the output side of current comparator 230 becomes greater than the current along the reference side of current comparator 230. The transconductances and other characteristics of devices 301 and 302 known in the art can be adjusted such that the current along the output side of current comparator 230 is four times greater than the magnitude of the current along the reference side of current comparator 230 when the magnitude of the voltage at node 111 is greater than the magnitude of substantially constant voltage 240. Under these conditions, the output of current comparator 230 is a high voltage signal, which turns on device 220. When device 220 is on, a current is drawn through resistor 210 by device 220, and the magnitude of the voltage at node 111 is reduced to be less than or equal to the magnitude of substantially constant voltage 240 as the signal is transferred from node 111 to node 131. When the magnitude of the voltage at node 111 is much greater than the magnitude of substantially constant voltage 240, a much larger current needs to be drawn through resistor 210 by device 220 because a larger voltage has to be dropped across resistor 210.

Comparator 230 also operates to compare the magnitude of the voltage at node 111 to substantially constant voltage 240 when integrated circuit 100 of FIG. 1 is turned off or is operated in a sleep mode or suspend mode. Here, substantially constant voltage 240 is at approximately zero volts. Under these conditions, device 301 acts as a switch. Therefore, the voltage at node 111 is transferred to the second terminal of device 220. Accordingly, when the voltage at node 111 is greater than zero, device 220 is turned on and pulls a current through resistor 210.

As the magnitude of the voltage at node 111 increases further, device 305 begins to conduct current to device 304. Device 303 acts as a shunt feedback to the second terminal of device 202 because device 303 conducts four times the current in device 304. Therefore, device 303 maintains a substantially constant bias on device 220. Accordingly, device 220 sustains an acceptably low voltage to protect circuit 140 (FIG. 1) coupled to the other side of node 131, even though substantially constant voltage 240 is at zero volts.

When circuit 121 is activated by a substantially large input voltage at node 111, device 220 acts as a shunt resistance to ground in series with resistor 210. This creates a voltage divider at node 131, which is transmitted to circuit 140 (FIG. 1) coupled to the other side of node 131. The ratio of this voltage division is controlled by the resistance of resistor 210 and the size of device 220.

When substantially constant voltage 240 in integrated circuit 100 in FIG. 3 is at zero volts, device 305 in FIG. 3 is turned on when the voltage at node 111 increases above zero volts. Under these conditions, device 305 fixes the output of current comparator 230 at a gate-to-source voltage drop ($V_{GS}$) above ground potential. Device 305 also conducts a current into device 304 along the reference side of current comparator 230. This current is reflected or mirrored in the output side of current comparator 230 by device 303 to stabilize the output of current comparator 230 and to drive or turn on device 220.

When substantially constant voltage 240 is zero volts, resistor 309 is used to limit the current between node 111 and the first terminal of device 301. Without resistor 309, the amount of current conducted through device 301 may become large because device 301 acts as a switch. The large amount of current, however, may damage device 301 and comparator 230. Resistor 309 is not required when integrated circuit 100 in FIG. 3 is in an active mode because comparator 230 operates as a current source during the active mode.

From a power dissipation perspective, the resistance of resistor 210 is preferably as large as possible. In this embodiment, device 220 can be smaller and less current can be drawn through resistor 210 to achieve a higher voltage drop across resistor 210. Resistor 210, however, also acts as a low-pass filter because of the internal capacitance at node 131. Depending on its application, integrated circuit 100 in FIG. 1 may have a high bandwidth requirement so that the electrical performance of integrated circuit 100 is not adversely affected by clamp circuit 121 (FIG. 1). To achieve the high bandwidth specification, the resistance of resistor 210 is small. In the preferred embodiment, resistor 210 has a resistance of approximately 30 ohms to ensure that integrated circuit 100 in FIG. 1 has a high bandwidth of approximately 2 GigaHertz (GHz) while minimizing the required size of device 220. In an application where low bandwidths are acceptable, resistor 210 preferably has a much larger resistance.

Figure 4:
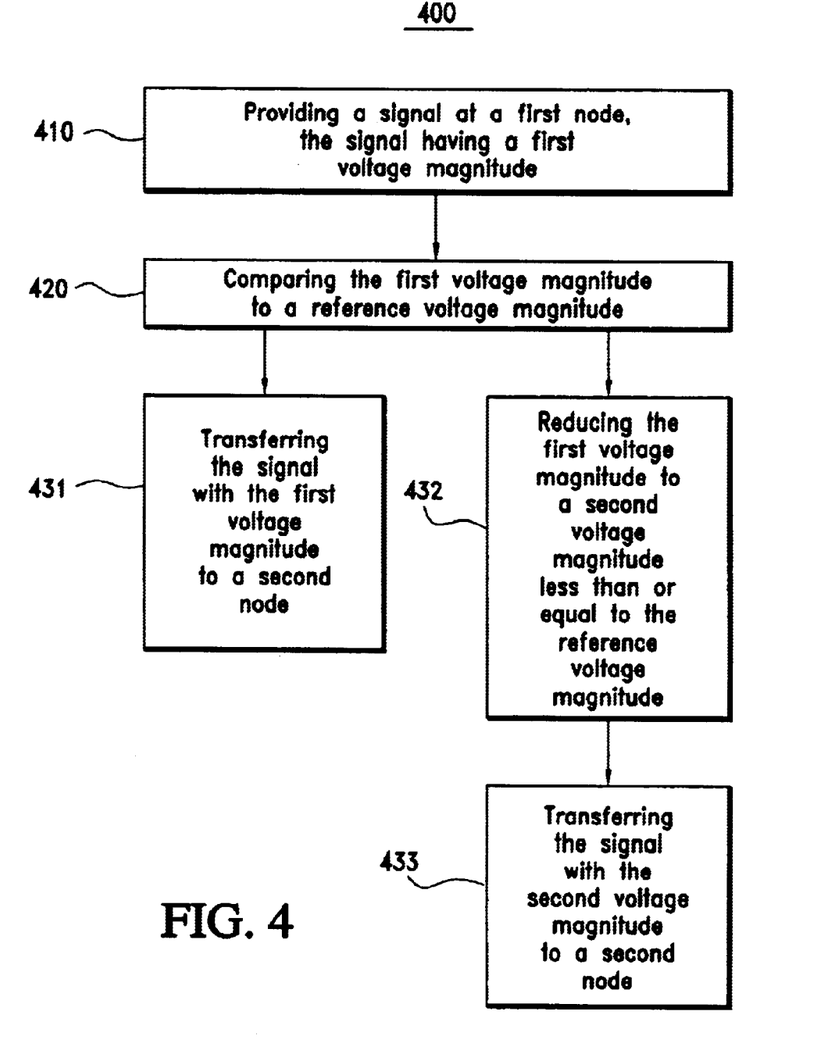
FIG. 4 illustrates a flow chart of a method of operating an integrated circuit in accordance with an embodiment of the invention.

FIG. 4 illustrates a flowchart 400 of a method of operating an integrated circuit. In the preferred embodiment, the integrated circuit is similar to integrated circuit 100 of FIG. 1. At a first step of flowchart 400, a signal is provided at a first node of the integrated circuit, and the signal has a voltage magnitude. For example, the first node of step 410 can be similar to node 111 in FIGS. 1, 2, and 3.

At a step 420 of flowchart 400 in FIG. 4, the voltage magnitude of the signal is compared to a magnitude of a reference voltage. As an example, the reference voltage can be similar to substantially constant voltage 240 of FIGS. 2 and 3, and the comparison of step 420 can be performed by comparator 230 of FIGS. 2 and 3.

Next, if the voltage magnitude of the signal is less than the magnitude of the reference voltage, then a step 431 of flowchart 400 in FIG. 4 is performed. At step 431, the signal at the first node is transferred with its voltage magnitude to a second node. As an example, the second node in step 431 can be similar to node 131 in FIGS. 1, 2, and 3.

If the voltage magnitude of the signal is greater than the magnitude of the reference voltage, however, then a step 432 of flowchart 400 in FIG. 4 is performed. At step 432, the voltage magnitude of the signal is reduced to a different voltage magnitude that is less than or equal to the magnitude of the reference voltage. Next, at a step 433 of flow chart 400, the signal with its reduced voltage magnitude is transferred to the second node.

Accordingly, an improved integrated circuit and method of operation is provided to overcome the disadvantages of the prior art. The integrated circuit is protected from short-term and long-term voltage spikes or surges and is compatible with the specification requirements of USB and other I/O circuitry.

Although the invention has been described with reference to specific embodiments, it will be understood by those skilled in the art that various changes may be made without departing from the spirit or scope of the invention. For instance, the numerous details set forth herein such as, for example, the resistances of specific resistors and the relative sizes of specific transistors are provided to facilitate the understanding of the invention and are not provided to limit the scope of the invention. As another example, the first type of three-terminal device can be a p-channel MOSFET, and the second type of three-terminal device can be an n-channel MOSFET. Furthermore, other embodiments of comparator 230 (FIG. 3) and circuit 121 (FIGS. 2 and 3) can be used in integrated circuit 100 (FIG. 1). Accordingly, the disclosure of embodiments of the invention is intended to be illustrative of the scope of the invention and is not intended to be limiting. It is intended that the scope of the invention shall be limited only to the extent required by the appended claims.

What is claimed is:

1. An integrated circuit comprising:
a first node;
a second node;
a resistor coupling together the first and second nodes;
a comparator having two inputs and an output, a first one of the two inputs coupled to the resistor and the first node; and
a three-terminal device having a first terminal coupled to the second node and the resistor and having a second terminal coupled to the output of the comparator.

2. The integrated circuit of claim 1 wherein:
a second one of the two inputs of the comparator coupled to a first substantially constant voltage; and
a third terminal of the three-terminal device coupled to a second substantially constant voltage.

3. The integrated circuit of claim 2 wherein:
the first substantially constant voltage is provided by a voltage supply; and
the second substantially constant voltage is a ground potential.

4. The integrated circuit of claim 2 wherein:
the three-terminal device is a MOSFET;
the first terminal of the three-terminal device is a drain electrode of the MOSFET;
the second terminal of the three-terminal device is a gate electrode of the MOSFET; and
the third terminal of the three-terminal device is a source electrode of the MOSFET.

5. The integrated circuit of claim 1 wherein:
the three-terminal device is a MOSFET;
the first terminal of the three-terminal device is a drain electrode of the MOSFET; and
the second terminal of the three-terminal device is a gate electrode of the MOSFET.

6. The integrated circuit of claim 1 wherein:
a magnitude of a voltage at the second node is less than a magnitude of a voltage at a second one of the two inputs of the comparator.

7. The integrated circuit of claim 1 wherein:
the second terminal of the three-terminal device is a control electrode; and
the three-terminal device is turned on by the control electrode when a magnitude of a voltage at the first node is greater than a magnitude of a voltage at a second one of the two inputs of the comparator.

8. The integrated circuit of claim 1 wherein:
when a magnitude of a voltage at the first node is greater than a magnitude of a voltage at a second one of the two inputs of the comparator, the three-terminal device turns on to reduce a magnitude of a voltage at the second node to be less than or equal to the magnitude of the voltage at the second one of the two inputs of the comparator.

9. The integrated circuit of claim 1 further comprising:
an input signal coupled to the first node.

10. The integrated circuit of claim 9 further comprising:
a voltage-sensitive circuit coupled to the second node, wherein:
the voltage-sensitive circuit processes the input signal.

11. An integrated circuit comprising:
a first circuit;
a first node; and
a second circuit coupling the first circuit to the first node;
wherein:
the first circuit operates off of a supply voltage; and
the second circuit detects a voltage magnitude of a signal at the first node and reduces the voltage magnitude of the signal to equal a voltage magnitude of the supply voltage before transmitting the signal to the first circuit.

12. The integrated circuit of claim 11 further comprising:
a second node; and
a third circuit coupling the first circuit to the second node;
wherein:
the third circuit detects a voltage magnitude of a different signal at the second node and reduces the voltage magnitude of the different signal to equal a voltage magnitude of the supply voltage before transmitting the different signal to the first circuit.

13. An integrated circuit comprising:
a first node;
a second node;
a first resistor coupling together the first and second nodes;
a first three-terminal device being of a first type, a first terminal of the first three-terminal device coupled to the first resistor and the first node;
a second three-terminal device being of the first type, a first terminal of the second three-terminal device coupled to a first substantially constant voltage, a second terminal of the second three-terminal device coupled to a second terminal of the first three-terminal device and to a third terminal of the second three-terminal device;
a third three-terminal device being of a second type, a first terminal of the third three-terminal device coupled to a second substantially constant voltage, a third terminal of the third three-terminal device coupled to a third terminal of the first three-terminal device;
a fourth three-terminal device being of the second type, a first terminal of the fourth three-terminal device coupled to the second substantially constant voltage, a second terminal of the fourth three-terminal device coupled to a second terminal of the third three-terminal device and to a third terminal of the fourth three-terminal device;
a fifth three-terminal device being of the second type, a first terminal of the fifth three-terminal device coupled to the second substantially constant voltage, a second terminal of the fifth three-terminal device coupled to the third terminals of the first and third three-terminal devices, a third terminal of the fifth three-terminal device coupled to the first resistor and to the second node;

a sixth three-terminal device being of the first type, a first terminal of the sixth three-terminal device coupled to the third terminals of the first and third three-terminal devices and to the second terminal of the fifth three-terminal device, a second terminal of the sixth three-terminal device coupled to the first substantially constant voltage, a third terminal of the sixth three-terminal device coupled to the second terminals of the third and fourth three-terminal devices and to the third terminal of the fourth three-terminal device; and a second resistor coupling together the second terminals of the first and second three-terminal devices and the third terminal of the second three-terminal device to the second terminals of the third and fourth three-terminal devices and to the third terminals of the fourth and sixth three-terminal devices.

14. The integrated circuit of claim 13 wherein:

the first, second, third, fourth, fifth, and sixth three-terminal devices are MOSFETs.

15. The integrated circuit of claim 13 wherein:

the first, second, and sixth three-terminal devices are p-channel MOSFETs; and the third, fourth, and fifth three-terminal devices are n-channel MOSFETs.

16. The integrated circuit of claim 15 wherein:

the first terminals of the first, second, third, fourth, fifth, and sixth three-terminal devices are source electrodes;

the second terminals of the first, second, third, fourth, fifth, and sixth three-terminal devices are gate electrodes; and the third terminals of the first, second, third, fourth, fifth, and sixth three-terminal devices are drain electrodes.

17. The integrated circuit of claim 13 further comprising:

a seventh three-terminal device, second and third terminals of the seventh three-terminal device coupled to the second terminal of the fifth three-terminal device, to the third terminals of the first and third three-terminal devices, and to the first terminal of the sixth three-terminal device.

18. The integrated circuit of claim 17 further comprising:

an eighth three-terminal device, a first terminal of the eighth three-terminal device coupled to the second substantially constant voltage, second and third terminals of the eighth three-terminal device coupled to a first terminal of the seventh three-terminal device.

19. The integrated circuit of claim 13 further comprising:

a third resistor coupling the first node and the first resistor to the first terminal of the first three-terminal device.

20. The integrated circuit of claim 19 further comprising:

a seventh three-terminal device, second and third terminals of the seventh three-terminal device coupled to the second terminal of the fifth three-terminal device, to the third terminals of the first and third three-terminal devices, and to the first terminal of the sixth three-terminal device; and an eighth three-terminal device, a first terminal of the eighth three-terminal device coupled to the second substantially constant voltage, second and third terminals of the eighth three-terminal device coupled to a first terminal of the seventh three-terminal device.

21. The integrated circuit of claim 20 wherein:

the first, second, and sixth three-terminal devices are p-channel MOSFETs;

the third, fourth, and fifth three-terminal devices are n-channel MOSFETs;

the first terminals of the first, second, third, fourth, fifth, and sixth three-terminal devices are source electrodes;

the second terminals of the first, second, third, fourth, fifth, and sixth three-terminal devices are gate electrodes; and the third terminals of the first, second, third, fourth, fifth, and sixth three-terminal devices are drain electrodes.

22. A method of operating an integrated circuit comprising:

detecting a signal at a first node, the signal having a first voltage magnitude;

comparing the first voltage magnitude to a reference voltage magnitude;

if the first voltage magnitude is less than the reference voltage magnitude,
    transferring the signal with the first voltage magnitude to a second node; and if the first voltage magnitude is greater than the reference voltage magnitude,
    reducing the first voltage magnitude to a second voltage magnitude less than or equal to the reference voltage magnitude; and
    transferring the signal with the second voltage magnitude to the second node.

23. The method of claim 22 further comprising:

providing a supply voltage for the integrated circuit; and providing a magnitude of the supply voltage for the reference voltage magnitude.

24. The method of claim 23 further comprising:

providing the magnitude of the supply voltage equal to approximately zero.

25. The method of claim 23 further comprising:

providing the magnitude of the supply voltage greater than zero.

26. The method of claim 23 further comprising:

varying the magnitude of the supply voltage from zero to greater than zero.

27. The method of claim 22 wherein:

reducing the first voltage magnitude further comprises:
    conducting a current across a resistor to reduce the first voltage magnitude to the second voltage magnitude.

28. The method of claim 27 wherein:

reducing the first voltage magnitude further comprises:
    turning on a transistor to conduct the current across the resistor.

29. The method of claim 22 further comprising:

operating the integrated circuit in a suspend mode;

detecting a different signal at the first node, the different signal having a third voltage magnitude;

comparing the first voltage magnitude to a different reference voltage magnitude;

if the third voltage magnitude is less than the different reference voltage magnitude,
    transferring the different signal with the third voltage magnitude to the second node; and if the third voltage magnitude is greater than the different reference voltage magnitude,
    reducing the first voltage magnitude to a fourth voltage magnitude less than or equal to the different reference voltage magnitude; and transferring the different signal with the fourth voltage magnitude to the second node.

30. The method of claim 22 further comprising:

operating the integrated circuit in a suspend mode;

detecting a different signal at the first node, the different signal having a third voltage magnitude;

comparing the first voltage magnitude to a different reference voltage magnitude;

if the third voltage magnitude is less than the different reference voltage magnitude, transferring the different signal with the third voltage magnitude to the second node; and if the third voltage magnitude is greater than the different reference voltage magnitude, reducing the first voltage magnitude to a fourth voltage magnitude less than or equal to the reference voltage magnitude; and transferring the different signal with the fourth voltage magnitude to the second node.

* * * * *